United States Patent
Lan et al.

(10) Patent No.: US 8,711,025 B2
(45) Date of Patent: Apr. 29, 2014

(54) METHOD FOR CONFIGURING ANALOG-TO-DIGITAL CONVERTER KEYS AND NON-TRANSITORY MACHINE READABLE MEDIUM STORING PROGRAM CODE EXECUTED FOR PERFORMING SUCH METHOD

(75) Inventors: Kun Lan, Hefei (CN); Yingyi Liu, Hefei (CN); Yu-Kai Chou, Hsinchu (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/612,680

(22) Filed: Sep. 12, 2012

(65) Prior Publication Data

US 2013/0201042 A1    Aug. 8, 2013

(30) Foreign Application Priority Data

Feb. 3, 2012    (CN) .......................... 2012 1 0023990

(51) Int. Cl.
*H03M 1/12*    (2006.01)
(52) U.S. Cl.
USPC ................. 341/155; 341/22; 341/24; 341/26

(58) Field of Classification Search
USPC ....................... 341/22, 24, 26, 155
See application file for complete search history.

(56) References Cited

U.S. PATENT DOCUMENTS

| | | | | |
|---|---|---|---|---|
| 4,884,070 A * | 11/1989 | Hannaford | ................ | 340/13.38 |
| 6,448,919 B1 * | 9/2002 | Claxton | ....................... | 341/155 |
| 7,026,973 B2 * | 4/2006 | Chu | ............................. | 341/155 |
| 7,446,691 B2 * | 11/2008 | Paul | ............................... | 341/155 |
| 7,688,230 B2 * | 3/2010 | DiFatta et al. | .................. | 341/22 |
| 7,768,436 B2 * | 8/2010 | Johnson | ....................... | 341/155 |

\* cited by examiner

*Primary Examiner* — Khai M Nguyen
(74) *Attorney, Agent, or Firm* — Winston Hsu; Scott Margo

(57) ABSTRACT

A method for configuring a plurality of analog-to-digital converter (ADC) keys includes: utilizing a processor for determining a plurality of divided-voltages respectively corresponding to the Keys according to a plurality of voltage variation ranges respectively corresponding to the Keys; and calculating a plurality of resistive values of a voltage dividing model according to at least the divided-voltages, wherein the voltage dividing model has a plurality of voltage dividing configurations respectively corresponding to the keys.

10 Claims, 3 Drawing Sheets

METHOD FOR CONFIGURING ANALOG-TO-DIGITAL CONVERTER KEYS AND NON-TRANSITORY MACHINE READABLE MEDIUM STORING PROGRAM CODE EXECUTED FOR PERFORMING SUCH METHOD

BACKGROUND

The present invention relates to an analog-to-digital (ADC) keypad, and more particularly to a method for configuring/calibrating the ADC keypad.

In general, a prior art analog-to-digital converter (ADC) keypad cannot be used for correctly discriminating an analog input signal generated at the output of the keypad from other signals since noise or power violation may cause each analog input signal to vary significantly. Thus, an ADC of the prior art ADC may generate the same digital output signal by converting two different analog input signals originally corresponding to different digital outputs. This results that the post-stage hardware or software element is unable to correctly identify which key is pressed.

SUMMARY

It is therefore one of the objectives of the present invention to provide a method for configuring/calibrating keys of the ADC keypad and a non-transitory machine readable medium for storing a program code which is executed for performing such method, to solve the above-mentioned problems.

According to an embodiment of the present invention, a method for configuring a plurality of keys of an analog-to-digital converter (ADC) keypad is disclosed. The method comprises: utilizing a processor for determining a plurality of divided-voltages respectively corresponding to the keys according to a plurality of voltage variation ranges respectively corresponding to the keys; and calculating a plurality of resistive values of a voltage dividing model according to at least the divided-voltages, wherein the voltage dividing model has a plurality of voltage dividing configurations corresponding to the keys, respectively.

According to an embodiment of the present invention, a non-transitory machine readable medium storing a program code executed for performing the above-mentioned method for configuring a plurality of keys of an analog-to-digital converter (ADC) keypad is disclosed.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

An embodiment of the invention may include functionality that may be implemented as software executed by a processor, hardware circuits or structures, or a combination of both. The processor may be a general-purpose or dedicated processor, such as a processor from the family of processors made by Intel Corporation, Motorola Incorporated, Sun Microsystems Incorporated and others. The software may comprise programming logic, instructions or data to implement certain functionality for an embodiment of the invention. The software may be stored in a medium accessible by a machine or computer-readable medium, such as read-only memory (ROM), random-access memory (RAM), magnetic disk (e.g. floppy disk and hard drive), optical disk (e.g. CD-ROM) or any other data storage medium). In one embodiment of the invention, the media may store programming instructions in a compressed and/or encrypted format, as well as instructions that may have to be compiled or installed by an installer before being executed by the processor. Alternatively, an embodiment of the invention may be implemented as specific hardware components that contain hard-wired logic for performing the recited functionality, or by any combination of programmed general-purpose computer components and custom hardware components.

Figure 1:
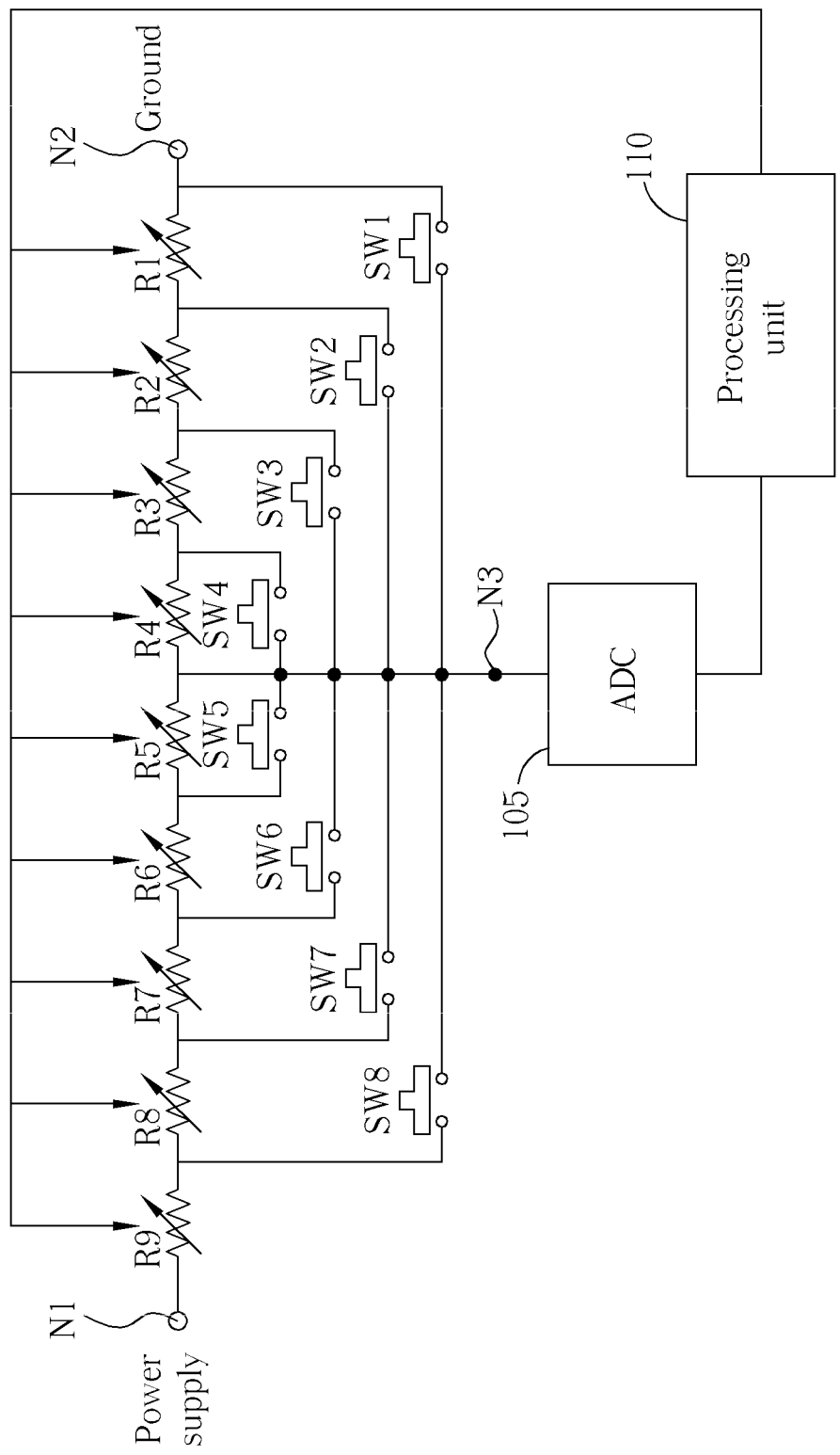
FIG. 1 is a block diagram illustrating a voltage dividing model of an analog-to-digital converter (ADC) keypad according to an embodiment of the present invention.

Please refer to FIG. 1, which is a block diagram illustrating a voltage dividing model of an analog-to-digital converter (ADC) keypad according to an embodiment of the present invention. In this embodiment, the ADC keypad includes eight keys K1-K8 which respectively correspond to different switch units SW1-SW8 as shown in FIG. 1. When a key of the ADC keypad is pressed, a corresponding switch unit is enabled to become 'closed', i.e. the corresponding switch unit enters into a closed state from an open state. For example, when the key K1 is pressed, the switch unit SW1 is 'closed'. In this embodiment, it is assumed that only one key will be pressed each time and only one switch unit will be enabled to become closed each time; this is not intended to be a limitation of the present invention. Two or more keys can also be pressed at the same time. In addition, the number of keys of the ADC keypad is not meant to be a limitation of the present invention. The number of keys can be configured to be greater than or less than eight. The voltage dividing model is comprised by the switch units SW1-SW8, a plurality of resistor units R1-R9, and an analog-to-digital converter (ADC) 105. The resistor units R1-R9 are arranged in series. The switch units SW1-SW8 are electronically connected to the resistor units R1-R9 as shown in FIG. 1. A power supply signal with a voltage level VCC is supplied to the voltage dividing model via the node N1 and is connected to the resistor unit R9. A ground level or a fixed reference voltage level is connected to the voltage dividing model via the node N2 and is also connected to the resistor unit R1.

The resistor units R1-R9 and the switch units SW1-SW8 can form different voltage dividing configurations under different conditions. Different divided-voltages can be generated and outputted to the ADC 105 via the node N3. When a certain key is pressed, a corresponding voltage dividing configuration of the voltage dividing model is established. For example, when the key K1 is pressed, the switch unit SW1 becomes closed and then the node N3 is connected to the node N2 which is coupled to the ground level or fixed reference voltage level. If the node N2 is coupled to the ground level and the key K1 is pressed, then the output signal of the voltage dividing model connected to the node N3 becomes zero volts.

The output signal (i.e. an analog signal) of the voltage dividing model is provided to the post-stage ADC 105 shown in FIG. 1. The ADC 105 is used to convert an analog input signal into a digital output signal and then output the converted digital signal to a post-stage processing unit 110. The converted digital signal generated by the ADC 105 can be represented by bits, and information of the bits is read by the processing unit 110. The processing unit 110 is used to identify which key is pressed by detecting the converted digital signal at the output of the ADC 105, and can be implemented by a hardware circuit element, a software unit, a software package, or a program code stored in a memory. In this embodiment, as shown in FIG. 1, the processing unit 110 is implemented by a program code stored in a non-transitory machine readable medium storing, and such program code is executed by a processor such as a central processing unit (CPU).

Ideally, a corresponding divided-voltage is generated at the input of the ADC 105 when a certain key is pressed, and another different divided-voltage is generated when another key is pressed. In practice, however, each of the divided-voltages varies due to a variety of non-ideal factors, and the conversion of the ADC 105 may be non-ideal. For example, there may be power violations, power noises, ADC offsets, and nonlinear characteristics of the ADC 105 etc., and all of these will raise the difficulty of discriminating a divided-voltage corresponding to a key from the divided-voltages corresponding to the others keys. In this embodiment, the processing unit 110 is utilized for resolving the problem mentioned above. In order to identify which key is pressed, the processing unit 110 is arranged to configure corresponding voltage variation ranges of the keys K1-K8 when pressed so that each of the voltage variation ranges does not overlap with the others; the ADC 105 can therefore convert the different analog voltage signals into different digital outputs. Then, the processing unit 110 can correctly identify which key is pressed by detecting the digital outputs. In addition to considering the non-ideal characteristics of the power supply signal, the processing unit 110 is arranged to configure the voltage variation ranges further based on the non-ideal characteristics of the ADC 105. The above-mentioned voltage design can be regarded as a kind of voltage calibration, wherein by doing this voltage calibration the objective of correctly identifying which key is pressed can be achieved. In this preferred embodiment, the processing unit 110 in a first phase is executed to configure/determine a plurality of divided-voltage levels and associated voltage variation ranges according to the above-mentioned non-ideal factors. In a second phase, the processing unit 110 is executed to calculate the resistances of the resistor units R1-R9 according to the configured/determined voltage levels and associated voltage variation ranges. In a third phase, the processing unit 110 is executed to adjust the resistances of the resistor units R1-R9 and to derive the divided-voltage levels and associated voltage variation ranges in accordance with the adjusted resistances of the resistor units R1-R9. Finally, the processing unit 110 is executed to re-check the divided-voltage levels and associated voltage variation ranges, and if a check result succeeds, then the adjust resistances can be used to implement the ADC keypad as shown in FIG. 1. Otherwise, if the check result fails, then the resistances will be adjusted or calibrated again.

Figure 2:
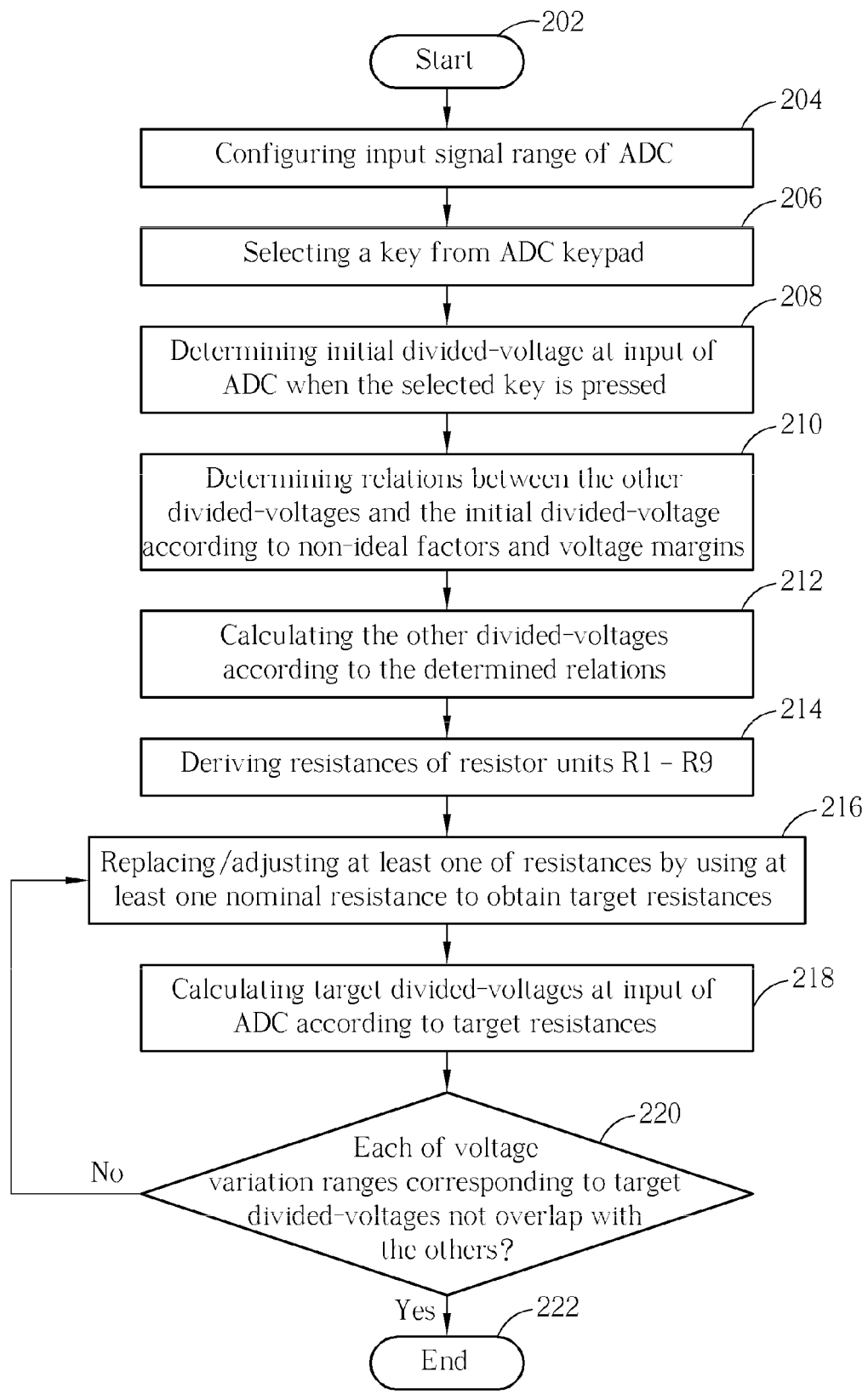
FIG. 2 is a diagram showing a flowchart of a method for configuring a plurality of keys of an analog-to-digital converter (ADC) keypad shown in FIG. 1.

Please refer to FIG. 2. FIG. 2 is a diagram showing a flowchart of a method for configuring a plurality of keys of an analog-to-digital converter (ADC) keypad according to an embodiment of the present invention. Provided that substantially the same result is achieved, the steps of the flowchart shown in FIG. 2 need not be in the exact order shown and need not be contiguous; that is, other steps can be intermediate. The steps shown in FIG. 2 are detailed in the following:

Step 202: Start;

Step 204: Configure the input signal range of the ADC 105;

Step 206: Select a key from the keys K1-K8 of the ADC keypad;

Step 208: Determine an initial divided-voltage at the input of the ADC 105 when the selected key is pressed;

Step 210: Determine relations between the other initial divided-voltages and the initial divided-voltage corresponding to the selected key according to non-ideal factors and voltage margins;

Step 212: Calculate the other initial divided-voltages according to the determined relations;

Step 214: Derive the resistances of the resistor units R1-R9 according to the calculated divided-voltages and the determined initial divided-voltage;

Step 216: Replace/adjust at least one of the resistances of the resistor units R1-R9 by using at least one nominal resistance to obtain a set of target resistances;

Step 218: Calculate a set of target voltages according to the target resistances;

Step 220: Check the set of target voltages and corresponding voltage variation ranges; if the check result fails, the flow proceeds to Step 216, otherwise, the flow proceeds to Step 222; and Step 222: End.

In Step 204, the processing unit 110 is arranged to configure the input signal range of the ADC 105 according to power violation of the power supply signal with the voltage level VCC, the power noise of the power supply signal, and the linear input signal range of the ADC etc. For example, ideally the power supply signal provides a stable voltage level VCC such as 3.3 volts. In practice, however, the power violation may cause the stable voltage level VCC provided by the power supply signal to vary in a range between 110% and 90%. In addition, the power noise may exert some voltage variations between +300 mV and −300 mV to the voltage level VCC. The non-linear characteristics of the ADC 105 may limit or reduce the available input range of the ADC 105 in practice. For instance, the linear input signal range of the ADC 105 may be a range between 0.2 volts and 2.6 volts rather than a range between 3.3 volts and zero volts. Accordingly, the processing unit 110 in Step 202 is arranged to appropriately configure the input signal range of the ADC 105 by considering the non-ideal factors described above. For example, in this embodiment, the input signal range of the ADC 105 is configured in a range between 0.42 volts and 2.38 volts.

In Step 206, in this embodiment, the processing unit 110 is arranged to select the key K1, i.e. the first key. This is not intended to be a limitation of the present invention. In another embodiment, the processing unit 110 can also select the key K8, i.e. the last key. Further, the processing unit 110 can also select another key except of the keys K1 and K8.

In Step 208, the processing unit 110 is arranged to determine a first divided-voltage at the input of the ADC 105 according to the voltage dividing model shown in FIG. 1 when the selected key is pressed. In this embodiment, the selected key is K1, and the switch unit SW1 is closed when the key K1 is pressed. Accordingly, the processing unit 110 can determine the first divided-voltage as zero volts. In other embodiments, the processing unit 110 can set the first divided-voltage as a voltage level different from zero volts such as a voltage which is closer to zero volts. This also falls within the scope of the present invention.

Figure 3:
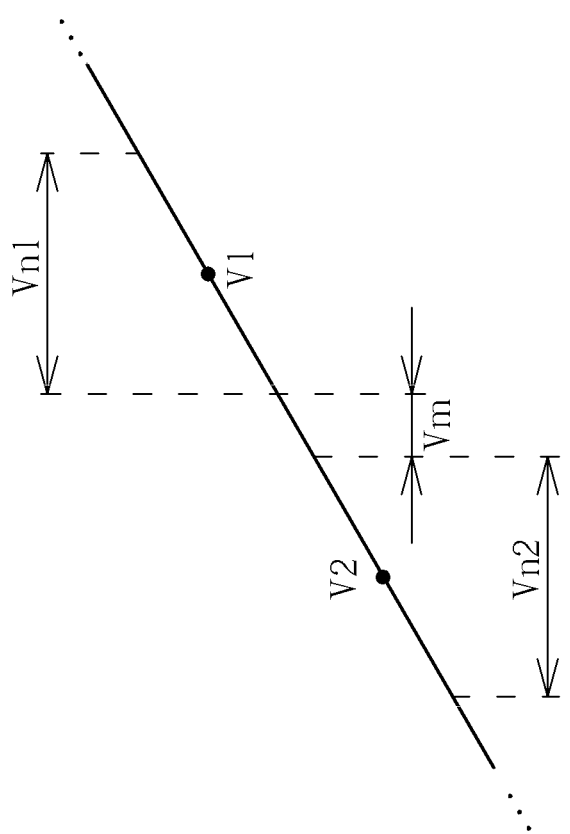
FIG. 3 is a diagram of an example showing the operation of determining a relation between a second divided-voltage and the first divided-voltage corresponding to the selected key shown in FIG. 1.

In Step 210, the processing unit 110 is arranged to determine relations between the other divided-voltages and the first divided-voltage corresponding to the selected key K1 one by one according to the non-ideal factors and voltage margins. Please refer to FIG. 3, which is a diagram of an example showing the operation of determining a relation between a second divided-voltage and the first divided-voltage corresponding to the selected key K1. In this example, since the selected key is K1, the processing unit 110 is arranged to determine a voltage variation range corresponding to the key K1 when pressed. The voltage variation range of the key K1 can be determined in the following equation:

$$Vn1 = V1 \div VCC \times VR\_1 \quad \text{Equation (1)}$$

wherein the voltage variation range, the initial divided-voltage, the ideal voltage level of the power supply signal, and the variation coefficient are represented by the parameters $Vn1$, $V1$, $VCC$, and $VR\_1$, respectively. Equation (1) implies a relation between the first divided-voltage V1 and the voltage variation range Vn1 of the first divided-voltage V1. That is, the voltage variation range Vn1 is determined according to at least the noise variation.

After determining the equation of the voltage variation range corresponding to the key K1, the processing unit 110 is arranged to determine a voltage variation range corresponding to another key such as the key K2 when pressed. The voltage variation range mentioned above can be explained in Equation (2):

$$Vn2 = V2 \div VCC \times VR\_2 \quad \text{Equation (2)}$$

wherein the voltage variation range, the divided-voltage, the ideal voltage level of the power supply signal, and the variation coefficient are represented by the parameters $Vn2$, $V2$, $VCC$, and $VR\_2$, respectively. Equation (2) implies a relation between the second divided-voltage V2 and the voltage variation range Vn2 of the second divided-voltage V2. The voltage variation range Vn2 is determined according to at least the noise variation.

The processing unit 110 then is arranged to configure a voltage margin Vm between the divided-voltages V1 and V2 and further to configure a non-linear factor NF indicating the mismatch of the resistor units R1-R9. In other words, the voltage variation ranges Vn1 and Vn2 are determined according to at least one of the non-linear factors of the voltage dividing mode. Accordingly, the processing unit 110 can obtain an equation as below:

$$(Vn1 \div 2 \times NF) + (Vn2 \div 2 \times NF) + Vm = V1 - V2 \quad \text{Equation (3)}$$

Consequently, the processing unit 110 can derive a relation of the divided-voltage V2 according to equations (1)-(3):

$$V2 = \frac{\left(1 - \frac{VR\_1 \times NF}{2 \times VCC}\right) \times V1 - Vm}{\left(1 + \frac{VR\_2 \times NF}{2 \times VCC}\right)}; \quad \text{Equation (4)}$$

After determining the equation of the divided-voltage V2 corresponding to the key K2 when pressed, the processing unit 110 is arranged to respectively obtain equations of the other divided-voltages V3-V8 corresponding to the keys K3-K8 when pressed one by one. The equations of the divided-voltages V3-V8 can be determined according to the initial divided-voltage V1 or in accordance with the equation of the divided-voltage V2. This is not intended to be a limitation of the present invention. After the equations of the divided-voltages V2-V8 are determined, the operation of Step 210 is finished and the flow proceeds to Step 212.

In Step 212, the processing unit 110 is arranged to calculate the divided-voltages V2-V8 according to the determined relations (i.e. the equations of the divided-voltages v2-V8) illustrated in Step 210. Each equation of the divided-voltages V2-V8 can be represented by using the parameters VCC, VR_1-VR_8, NF, Vm, and V1. VCC is a given value which indicates the voltage level of the power supply signal, and V1 is a predetermined initial divided-voltage level. Accordingly, by appropriately configuring VR_1-VR_8, NF, and Vm, the processing unit 110 can derive the divided-voltages V2-V8. Further, it should be noted that Steps 204-212 are used for setting the divided voltages V1-V8 in the linear input range of the ADC 105.

After the divided-voltages V2-V8 are calculated, the processing unit 110 in Step 214 is arranged to derive the resistances of the resistor units R1-R9 shown in FIG. 1 according to the calculated divided-voltages V2-V8 and the determined initial divided-voltage V1. Based on the voltage dividing model shown in FIG. 1, the processing unit 110 can obtain multiple simultaneous equations associated with the resistances of the resistor units R1-R9 when the different keys are pressed. Accordingly, the processing unit 110 can derive the resistances of the resistor units R1-R9 by resolving the multiple simultaneous equations. In this embodiment, the derived resistances are regarded as candidate resistances, and are then calibrated or adjusted to obtain target resistances.

Since certain of the calculated resistances may not be substantially equal to the nominal resistance, in a preferred embodiment it is required to adjust the calculated resistances by using at least one nominal resistance for obtaining a set of target resistances and then calculate target voltages corresponding to the set of target resistances when the different keys are pressed, in order to prevent voltage variances from occurring in the input of the ADC 105 during implementation. In Step 216, the processing unit 110 is arranged to compare each of the calculated resistances with multiple corresponding nominal resistances to determine which one of the nominal resistances can be used as a target resistance. In this way, the processing unit 110 determines corresponding nominal resistances for the calculated resistances one by one so as to obtain a set of target resistances. It should be noted that the operation of determining which one of the nominal resistances is to determine a nominal resistance that is approximate to the value of a calculated resistance; however, this is not meant to be a limitation of the present invention.

After the set of target resistances are determined, in Step 218, the processing unit 110 is arranged to calculate a set of target divided-voltages respectively corresponding to the keys K1-K8 when pressed according to the voltage dividing model shown in FIG. 1 and the determined target resistances of the resistor units R1-R9. After the target divided-voltages are calculated, the processing unit 110 in Step 220 is arranged to check the set of target divided-voltages and corresponding voltage variation ranges. The processing unit 110 is used for check whether each of the voltage variation ranges not overlap with the others. If each voltage variation range does not overlap with the others, this indicates that the divided-voltages corresponding to the keys when pressed can be correctly detected and the check result succeeds. When the check result succeeds, the process of adjusting/calibrating the resistances of the resistor units R1-R9 is finished, and the set of target resistances can be used to implement the resistor units R1-R9 of the ADC keypad. Otherwise, when the check result fails, the resistances of the resistor units R1-R9 are adjusted or calibrated again.

In the above-mentioned embodiment, the first selected key is K1, and the processing unit 110 in step 210 is executed to use the divided-voltage corresponding to the key K1 to determine a next key K2 wherein the divided-voltages corresponding to the keys K1 and K2 are adjacent divided-voltages. The voltage margin Vm is set between the voltage variation ranges Vn1 and Vn2 so as to ensure that either one of the voltage variation ranges Vn1 and Vn2 does not overlap with the other. In addition, the processing unit 110 is arranged to utilize a voltage value within the voltage margin Vm as a boundary between the voltage variation ranges Vn1 and Vn2, i.e. a boundary between a signal range of the first ADC key K1 and a signal range of the second ADC key K2. In detail, the voltage value can be located at a middle point of the voltage margin Vm. All these modifications fall within the scope of the present invention. Further, in other embodiments, the first selected key can be another key except of K1, and the processing unit 110 can determine a next key by selecting any one of the keys K1-K8 without choosing an adjacent key. In addition, the number or configuration of the resistor units and switch units as shown in FIG. 1 is merely used for illustrative purposes and is not a limitation of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for configuring a plurality of keys of an analog-to-digital converter (ADC) keypad, comprising:
   utilizing a processing unit for determining a plurality of divided-voltages respectively corresponding to the keys according to a plurality of voltage variation ranges respectively corresponding to the keys; and
   calculating a plurality of resistances of a voltage dividing model according to at least the divided-voltages, wherein the voltage dividing model has a plurality of voltage dividing configurations corresponding to the keys, respectively.

2. The method of claim 1, wherein the step of determining a plurality of divided-voltages comprises:
   setting the plurality of divided-voltages in a linear input range of an ADC.

3. The method of claim 1, wherein the step of determining a plurality of divided-voltages comprises:
   determining a first divided-voltage;
   determining a first relation between the first divided-voltage and a voltage variation range of the first divided-voltage;
   determining a second relation between a second divided-voltage and a voltage variation range of the second divided-voltage; and
   calculating the second divided-voltage according to at least the first relation and the second relation.

4. The method of claim 3, wherein the step of a first relation between the first divided-voltage and a voltage variation range of the first divided-voltage comprises:
   determining the voltage variation range of the first divided-voltage according to at least one of a first noise variation and a first non-linear factor of the voltage dividing model; and
   the step of determining a second relation between a second divided-voltage and a voltage variation range of the second divided-voltage comprises:
   determining the voltage variation range of the first divided-voltage according to at least one of a second noise variation and a second non-linear factor of the voltage dividing model.

5. The method of claim 3, wherein the step of determining a plurality of divided-voltages further comprises:
   setting a voltage margin between the voltage variation range of the first divided-voltage and the voltage variation range of the second divided-voltage, wherein the first and second divided-voltages are adjacent divided-voltages; and
   the step of calculating the second divided-voltage according to the first relation and the second relation comprises:
   calculating the second divided-voltage according to the first relation, the second relation, and the voltage margin.

6. The method of claim 5, wherein the first divided-voltage and the second divided-voltage respectively correspond to a first ADC key and a second ADC key, and the method further comprises:
   utilizing a voltage value within the voltage margin as a boundary between a signal range of the first ADC key and a signal range of the second ADC key.

7. The method of claim 6, wherein the voltage value is located at a middle point of the voltage margin.

8. The method of claim 1, wherein the step of calculating a plurality of resistive values of a voltage dividing model comprises:
   calculating a plurality of candidate resistances of the voltage dividing model according to at least the divided-voltages corresponding to the Keys; and
   generating a plurality of target resistances as the resistive values of the voltage dividing model by utilizing at least one nominal resistive value to replace at least one of the candidate resistive values.

9. The method of claim 8, further comprising:
   calculating a plurality of target voltages respectively corresponding to the Keys according to the resistive values of the voltage dividing model; and
   checking whether a signal range of a target voltage corresponding to each ADC key does not overlap with another signal range of another target voltage corresponding to another ADC key.

10. A non-transitory machine readable medium storing a program code executed for performing the method of claim 1.

* * * * *